(12) United States Patent
Higashijima et al.

(10) Patent No.: US 8,002,894 B2
(45) Date of Patent: Aug. 23, 2011

(54) PROCESSING APPARATUS AND PROCESSING METHOD

(75) Inventors: Jiro Higashijima, Koshi (JP); Naoyuki Okamura, Koshi (JP); Kousuke Maeda, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1050 days.

(21) Appl. No.: 11/806,669

(22) Filed: Jun. 1, 2007

(65) Prior Publication Data
US 2007/0292611 A1 Dec. 20, 2007

(30) Foreign Application Priority Data
Jun. 2, 2006 (JP) .................................. 2006-154494

(51) Int. Cl.
C23C 16/56 (2006.01)
C23F 1/00 (2006.01)
H01L 21/306 (2006.01)
F16K 1/30 (2006.01)
F16K 31/00 (2006.01)
C23C 16/06 (2006.01)
C23C 16/22 (2006.01)

(52) U.S. Cl. ..................... 118/715; 156/345.1; 251/331; 251/335

(58) Field of Classification Search .................. 118/715; 156/345.1; 251/331, 335
See application file for complete search history.

(56) References Cited

U.S. PATENT DOCUMENTS

| 4,795,497 A | * | 1/1989 | McConnell et al. | ............. 134/18 |
| 6,176,265 B1 | | 1/2001 | Takahashi et al. | |
| 6,869,499 B2 | * | 3/2005 | Toshima et al. | .......... 156/345.29 |
| 7,086,410 B2 | | 8/2006 | Chouno et al. | |
| 2004/0002224 A1 | | 1/2004 | Chono et al. | |
| 2006/0079096 A1 | | 4/2006 | Nakamori et al. | |
| 2006/0099339 A1 | * | 5/2006 | Hashizume | ................... 427/240 |

FOREIGN PATENT DOCUMENTS

| EP | 1 077 473 | 2/2001 |
| JP | 2000-262874 | 9/2000 |
| JP | 2003-332322 | 11/2003 |
| JP | 2004-273553 | 9/2004 |
| WO | 02/09894 | 2/2002 |

OTHER PUBLICATIONS

European Search Report.
Japanese Office Action issued on Sep. 22, 2010 for Application No. 2006-154494 with English translation.

* cited by examiner

Primary Examiner — Rudy Zervigon
(74) Attorney, Agent, or Firm — Smith, Gambrell & Russell, LLP

(57) ABSTRACT

In a processing apparatus including a diaphragm valve provided on a process gas discharge line for discharging a process gas from a processing chamber and configured to control the internal pressure of the processing chamber by adjusting the opening of the diaphragm valve, an antistatic agent source is connected to the process gas discharge line at a position upstream of the diaphragm valve. Damage of a diaphragm valve element due to spark discharge resulted from electric charge generated by friction between the gas flowing through the diaphragm valve and the diaphragm valve element can be prevented.

14 Claims, 2 Drawing Sheets

PROCESSING APPARATUS AND PROCESSING METHOD

TECHNICAL FIELD

The present invention relates to a processing apparatus and processing method that processes a process object, such as a semiconductor wafer or a glass substrate for liquid crystal display, with a process gas.

BACKGROUND ART

A series of steps for fabricating a semiconductor device or a flat panel display includes a step of processing a process object, such as a semiconductor wafer or a substrate for a liquid crystal display, with various process gases. In a case where a photoresist coated on a semiconductor wafer is to be removed, there is performed a process step that supplies a process gas comprising ozone and water vapor to the semiconductor wafer under high temperature and high pressure, thereby to render the photoresist on the semiconductor wafer water-soluble.

In a processing apparatus employed to perform the above process step, plural gas flow lines is provided to supply a process gas into a process chamber and to discharge the process gas from the process chamber. On a gas flow line through which a process gas flows, a diaphragm valve is provided for opening or shutting-off the gas flow line, or for controlling the internal pressure of the process chamber (See JP2004-2733553A, for example).

It is observed that a diaphragm valve element is electrically charged due to friction between the process gas and the diaphragm valve element when the process gas flows through the diaphragm valve. In a case where the process gas is a corrosive gas such as ozone, it is preferable that the material of the diaphragm valve element be a resin having excellent corrosion and chemical resistance such as a fluorine resin. However, a diaphragm valve element formed of a resin is likely to be electrically charged due to its low conductivity.

If the diaphragm valve element is electrically charged, it is possible that spark discharge occurs, and resultantly the diaphragm valve element is damaged so that pin holes are formed therein. Thus, the diaphragm valve element no longer functions properly, and it is possible that the processing of the process object can not be carried out properly.

SUMMARY OF THE INVENTION

The present invention has been made in view of the foregoing circumstances, and it is therefore the object of the present invention to provide a technique that prevents a diaphragm valve element from being electrically charged, prevents the diaphragm valve element from being damaged and prevents defective process due to failure of the diaphragm valve element.

In order to achieve the objective, according to a first aspect of the present invention, there is provided a processing apparatus including: a process chamber in which a process object is processed with a process gas; a plurality of gas flow lines including a process gas supply line for supplying the process gas into the process chamber and a process gas discharge line for discharging the process gas from the process chamber; a diaphragm valve provided on one of the gas flow lines; and an antistatic agent source connected to said one gas flow line at a position upstream of the diaphragm valve to supply an antistatic agent thereby to prevent the diaphragm valve from being electrically charged.

In one preferred embodiment, the diaphragm valve is provided on the process gas discharge line as said one gas flow line, and the antistatic agent source is connected to the gas discharge line at a position between the process chamber and the diaphragm valve.

In one preferred embodiment, the diaphragm valve is provided as a pressure control valve to control an internal pressure of the process chamber.

In one preferred embodiment, the antistatic agent source is configured to supply the antistatic agent at a flow rate within a flow rate range ensuring that change in the internal pressure of the process chamber due to supply of the antistatic agent does not occur.

In one preferred embodiment, the processing apparatus further includes a steam generator that generates water vapor as at least a part of the process gas, a steam discharge line as said one gas flow line is connected to the steam generator to discharge therefrom water vapor, and the diaphragm valve is provided on the steam discharge line. In this instance, the diaphragm valve may be provided as a pressure control valve to control an internal pressure of the steam generator. Preferably, the antistatic agent source is configured to supply the antistatic agent at a flow rate within a flow rate range ensuring that change in the internal pressure of the steam generator due to supply of the antistatic agent does not occur.

In one preferred embodiment, the antistatic agent comprises a liquid, which is deionized water into which carbon dioxide gas is dissolved.

In one preferred embodiment, the process gas contains water vapor.

In one preferred embodiment, the process gas contains water vapor and ozone; the gas discharge line is provided thereon with a mist trap that removes moisture contained in the processing fluid and an ozone killer that decomposes ozone positioned downstream of the mist trap; and the antistatic agent source is configured to supply the antistatic agent at a flow rate within a flow rate range ensuring that the antistatic agent is removed by the mist trap and does not flow into the ozone killer.

According to a second aspect of the present invention, there is provided a method of processing a process object, which includes the steps of: supplying a process gas into a process chamber to process a process object contained in the process chamber with the process gas; supplying an antistatic agent to a diaphragm valve, which is provided on a gas flow line through which a gas that may be included in the process gas flows, thereby preventing the diaphragm valve from being electrically charged. The antistatic agent may be supplied to the diaphragm valve together with the process gas.

BEST MODE FOR CARRYING OUT THE INVENTION

First, the structure of a substrate processing system including a processing apparatus according to the present invention is described. The description will be made assuming that the process object is a semiconductor wafer (i.e., substrate), and that the processing apparatus is configured to perform a water-solubilizing process that renders a photoresist coated on the surface of the wafer water-soluble.

Figure 1:
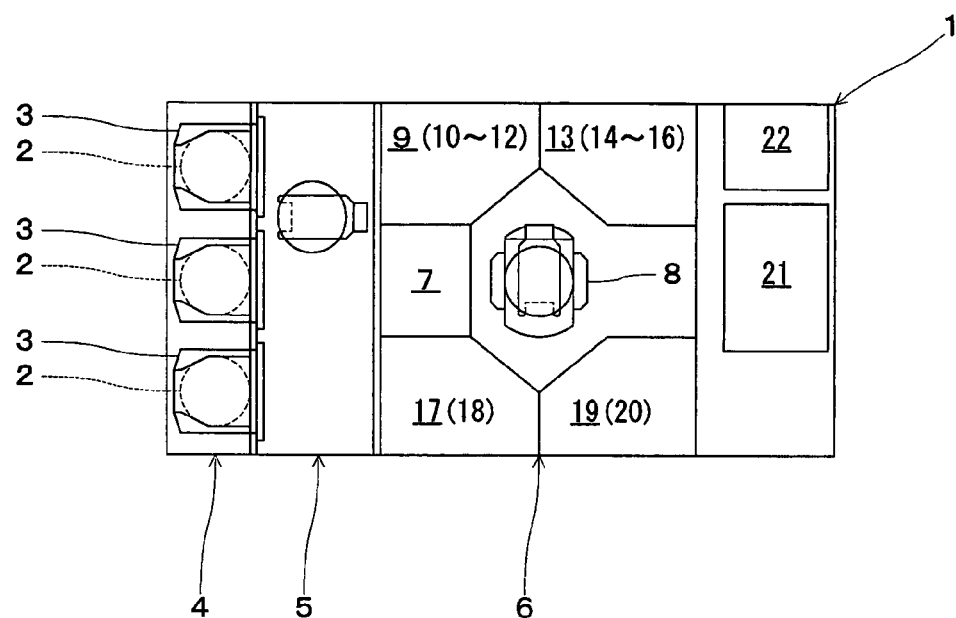
FIG. 1 is a plan view schematically showing the structure of a substrate processing system including a processing apparatus according to the present invention.
Figure 2:
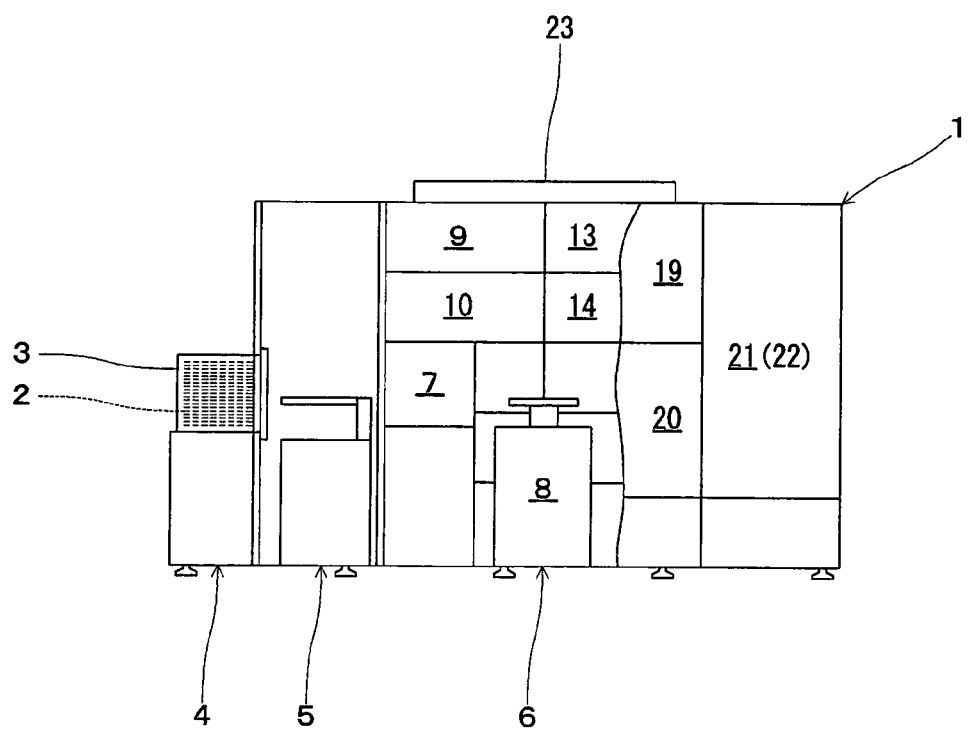
FIG. 2 is a schematic side elevation of the substrate processing system of FIG. 1.

The substrate processing system 1 is configured to perform various processes, such as a cleaning process and drying process, to wafers 2 (i.e., process objects). As shown in FIGS. 1 and 2, the substrate processing system 1 includes: a loading and unloading port 4 through which carriers 3 containing plural wafers 2 are loaded and unloaded into and from the substrate processing system 1; a substrate transfer unit 5 disposed behind the loading and unloading port 4; and a substrate processing block 6 disposed behind the substrate transfer unit 5 and including various processing units (i.e., processing apparatuses) to perform various processes to the wafers 2.

In the substrate processing block 6, a substrate transfer unit 7 is disposed at the center of the front end of the substrate processing block 6 to transfer unprocessed wafers 2 and processed wafers 2 to and from the substrate transfer unit 5. A main wafer conveyer 8 is disposed behind the substrate transfer unit 7 to transfer wafers 2 within the substrate processing block 6. On the left side of the main wafer conveyer 8, there are provided processing units 9-16 for the water-solubilizing process, which form two unit stacks arranged in the back and forth direction each including four processing units. On the right side of the main wafer conveyer 8, there are provided cleaning units 17-20 for cleaning process, which form two unit stacks arranged in the back and forth direction each including two cleaning units. Further, a processing-agent storage 21 and an ozone generator 22 are disposed at the rear end of the substrate processing block 6. A fan filter unit 23 is disposed at the top of the substrate processing block 6.

In operation of the substrate processing system 1, the substrate transfer unit 5 removes unprocessed wafers 2 one by one from a carrier 3 placed on the loading and unloading port 3, and transfers the wafer 2 to the wafer transfer unit 7. The wafer 2 is transferred by the main wafer conveyer 8 to any one of the processing units 9-16 where the wafer W is subjected to the water-solubilizing process to render the photoresist coated on the wafer 2 water-soluble. Thereafter, the wafer 2 is transferred by the main wafer conveyer 8 to any one of the cleaning units 17-20 where the photoresist coated on the wafer 2 is removed. The wafer 2 thus processed is transferred by the main wafer conveyer 8 to the substrate transfer unit 7, from which the substrate transfer unit 5 transfers the processed wafer 2 to the carrier 2 placed on the substrate loading and unloading port 4.

Next, the structure of the processing units 9-16 (i.e., processing apparatuses according to the present invention) which are the essential part of the present invention will be described. Since the processing units 9-16 have substantially the same structure, only the processing units 9 will be described.

Figure 3:
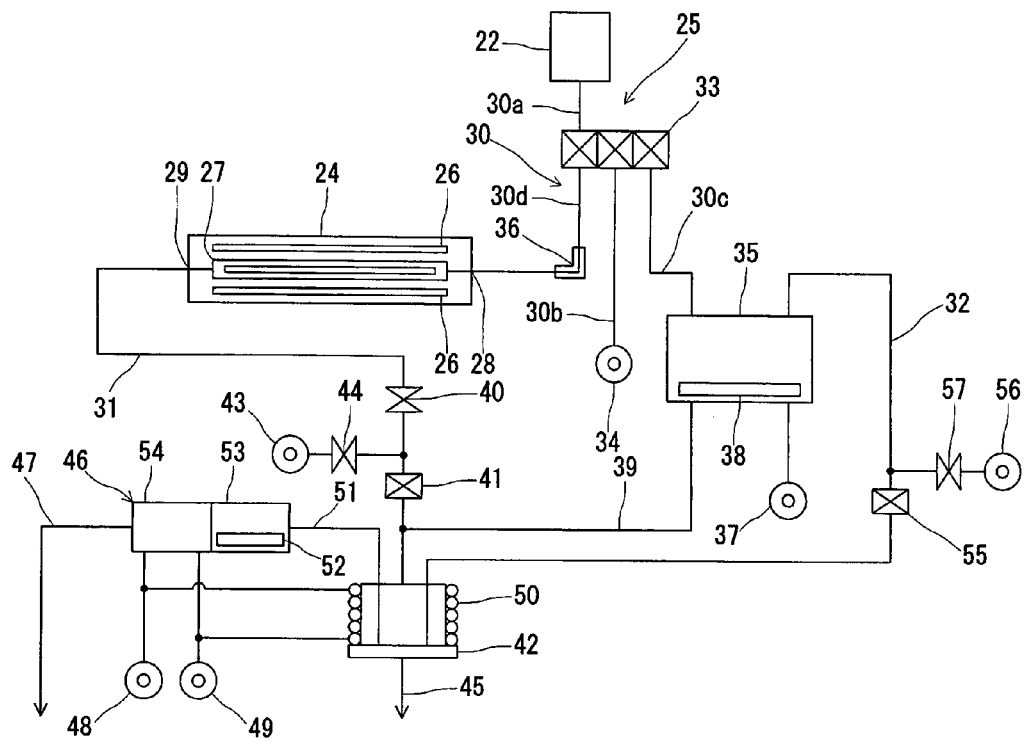
FIG. 3 is a piping diagram of the processing apparatus.

As shown in FIG. 3, the processing unit 9 includes a process chamber 24 adapted to process therein one wafer 2 with a process gas, and a piping system 25 provided mainly for allowing the process gas to flow through the process chamber 24.

The process chamber 24 is formed of a container of a rectangle box shape. Upper and lower heaters 26 are installed in the process chamber 24 to heat the inner processing space 27 of the process chamber 24 in which a wafer 2 is contained. The process chamber 24 has a gas inlet port 28 for supplying a process gas into the processing space 27 and a gas outlet port 29 for discharging the process gas from the processing space 27.

The piping system 25 comprises plural gas flow lines, which include process gas supply lines 30 for supplying the process gas into the process chamber 24, a process gas discharge line 31 for discharging the process gas from the process chamber 24, and a steam discharge line 32 for discharging water vapor from a steam generator 35.

The process gas supply lines 30 include first, second, third and fourth process gas supply lines 30a, 30b, 30c and 30d. The first process gas supply line 30a connects an ozone generator 22 to a first inflow port of a mixing valve 33. The second process gas supply line 30b connects a gas source 34 to a second inflow port of the mixing valve 33. The third process gas supply line 30c connects the steam generator 35 to a third inflow port of the mixing valve 33. The fourth process gas supply line 30d connects an outflow port of the mixing valve 33 to the process chamber 24. A temperature regulator 36 is provided on the fourth process gas supply line 30d.

The ozone generator 22 is configured to generate ozone by applying electric discharge to oxygen gas, and is configured to supply ozone or oxygen gas selectively.

The gas source 34 is adapted to supply a purge gas such as an inert gas (e.g., nitrogen gas) or air.

The steam generator 35 is configured to generate water vapor by heating deionized water supplied from a deionized water source 37 by means of a heater 38 installed in the steam generator 35. A deionized water discharge line 39 is connected to the steam generator 35 to discharge therefrom deionized water.

A process gas which is a mixture of ozone (i.e., ozone gas) generated by the ozone generator 22 and water vapor (i.e., gas of water) generated by the steam generator 35; only ozone or oxygen gas supplied from the ozone generator 22; only a purge gas supplied from the gas source 34; or only water vapor supplied from the steam generator 35 may be selectively supplied through the fourth process gas supply line 30d into the process chamber 24, by appropriately switching the status of the mixing valve 33 to selectively connect one or more of the first, second and third process gas supply lines 30a, 30b and 30c to the fourth process gas supply line 30d. In this instance, the temperature of the gas flowing through the fourth process gas supply line 30d is adjusted to an appropriate value by the temperature regulator 36 on demand before the gas is supplied into the process chamber 24.

The process gas discharge line 31 is connected to the gas outlet port 29 of the process chamber 24. A shutoff valve (open-close valve) 40, a pressure control valve 41 and a mist trap 41 are provided on the process gas discharge line 31 in that order from the upstream side. An antistatic agent source 43 is connected through a shutoff valve (open-close valve) 44 to the process gas discharge line 31 at a position between the shutoff valve 40 and the pressure control valve 41, in other words, at a position downstream of the process chamber 24 and upstream of the pressure control valve 41 adjacent to the same.

Pressure in the processing space 27 of the process chamber 24 can be regulated at a predetermined value by controlling the opening of the pressure control valve 41 provided on the process gas discharge line 31 and thus restricting the gas flow in the process gas discharge line 31. Details of the pressure control valve 41 and effects of the antistatic agent will be described later.

The mist trap 42 is provided with a cooling water circulating path 50 having one end connected to a cooling water supply part 48 and the other end connected to a cooling water discharge part 49. The mist trap 42 cools a gas flowing through the interior of the mist trap 42 by a cooling water flowing through the cooling water circulating path 50 thereby to perform gas-liquid separation, discharges a liquid separated from the gas into a drain pipe 45, and introduces the gas, from which the liquid is separated, into an ozone decomposer 46 through an exhaust line 51 (which is a part of the process gas discharge line 31).

The ozone decomposer 46 is composed of: an ozone killer 53 that heat ozone to decompose the same by means of a built-in heater 52; and a cooler 54 that cools the gas having been processed in the ozone killer 53. The cooler 54 is supplied with cooling water flowing from the cooling water supply part 48 to the cooling water discharge part 49, in order to cool a gas flowing through the interior of the cooler 54. An exhaust pipe 47 is connected to the cooler 54 to discharge therefrom a gas cooled by the cooler 54.

A pressure control valve 55 is provided on the steam discharge line 32 connected to the steam generator 35. The mist trap 42 is connected to the downstream end of the steam discharge line 32. An antistatic agent source 56 is connected through a shutoff valve (open-close valve) 57 to the steam discharge line 32 at a position between the steam generator 35 and the pressure control valve 55 (at a position upstream of the pressure control valve 55 adjacent to the same). Internal pressure of the steam generator 35 can be regulated at a predetermined value by controlling the opening of the pressure control valve 55 provided on the steam discharge line 32, whereby water vapor may be supplied through the process gas supply line 30c into the process chamber 24 at a desired flow rate and a desired pressure.

The structure of the pressure control valve 55 is the same as that of the pressure control valve 41, and the purpose of supplying an antistatic agent to the pressure control valve 55 is the same as that to the pressure control valve 41. The pressure control valve 41(55) will be described below.

Figure 4:
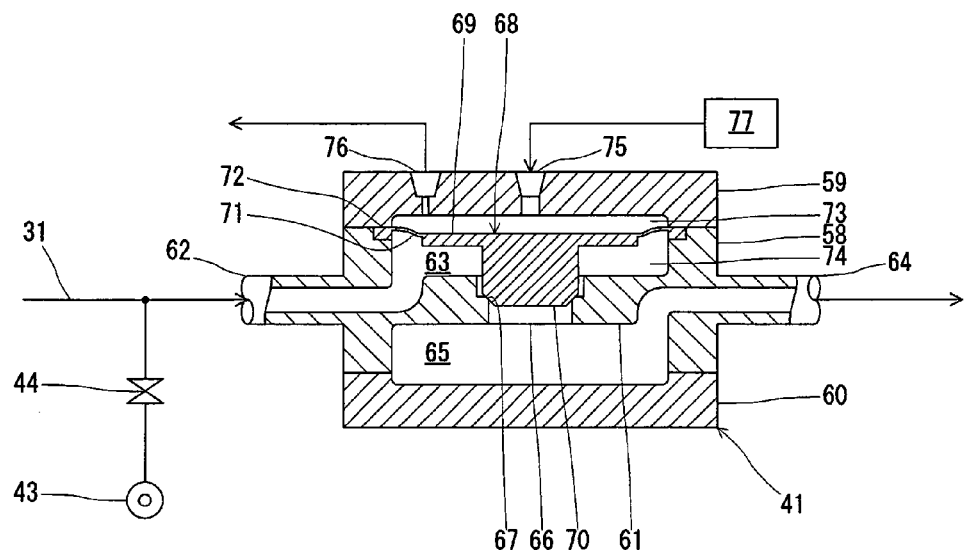
FIG. 4 is a vertical cross sectional view of a diaphragm valve.

As shown in FIG. 4, the pressure control valve 41 is a diaphragm valve. The pressure control valve 41 includes a casing 58 having a rectangle box shape, and an upper lid 59 and a lower lid 60 that close upper and lower openings of the casing 58, respectively. A partition wall 61 is formed at the center of the casing 58 to divide the interior space of the casing 58 into an upstream space 63 communicated with an inflow port 62 and a downstream space communicated with an outflow port 64.

A flow hole 66 passing vertically through the partition wall 61 to communicate the upstream space 63 and the downstream space 65 is formed in the partition wall 61 at the center thereof. Formed at an intermediate part of the flow hole 66 is a valve seat 67, to which a diaphragm valve element 67 is seated.

The diaphragm valve element 67 includes a disk-shaped part 69, a cylindrical protruding part 70 projecting downward from the center of the disk-shaped part 69, a thin annular flexible part 71 provided around the periphery of the disk-shaped part 69, a fixing part 72 provided around the periphery of the flexible part 71. The diaphragm valve element 67 is fixed in place within the casing 58 with the protruding part 70 being vertically displaceable, by sandwiching the fixing part 72 between the casing 58 and the upper lid 59.

The diaphragm valve element 67 divides the upstream space 63 into an upper pressure chamber 73 and a lower flow chamber 74. A pressure fluid inflow port 75 and a pressure fluid outflow port 76 are formed in the upper lid 59. An adjustable pressure source 77 is connected to the pressure fluid inflow port 75.

By controlling the internal pressure of the pressure chamber 73 by means of the adjustable pressure source 77, the diaphragm valve element 67 is dislocated so that the valve opening (i.e., the gap between the protruding part 70 and the valve seat 67) is adjusted, whereby the pressure control valve 41 can produce pressure difference between the space upstream of the diaphragm valve element 67 and the space downstream of the same due to its orifice effect, and thus the pressure control valve 41 can adjust pressure in the processing space 27. The pressure control valve 41 may control the pressure in the processing space 27 by rapidly switching the pressure control valve 41 between its fully-opened state and fully-closed state.

As previously described, the antistatic agent source 43 is connected through a shutoff valve 44 to the process gas discharge line 31 at a position upstream of the pressure control valve 41 adjacent to the same. When the shutoff valve 44 is opened, the antistatic agent flows from the antistatic agent source 43 toward the pressure control valve 41.

The antistatic agent may be any fluid containing a substance that reduces the resistivity of a fluid flowing through the pressure control valve, and may be deionized water into which any one or more of carbon dioxide gas, a rear gas, methane gas, hydrochloric acid, ammonia and hydrogen peroxide are dissolved. For the purpose of lower cost and easy handling, the antistatic agent is preferably deionized water into which carbon dioxide gas is dissolved.

The operation of the processing unit 9 (i.e., a processing apparatus according to the present invention) will be described below.

After a wafer 2 is loaded into the process chamber 2, the heater 26 heats the interior of the processing chamber 24 up to a predetermined temperature, and thereafter, ozone is supplied from the ozone generator 22 through a mixing valve 33.

At this time, the shutoff valve 40 is opened, and the opening of the pressure control valve 41 is appropriately adjusted to maintain the internal pressure of the process chamber 24 at a predetermined value. The shutoff valve 44 is also opened so that the antistatic agent is supplied from the antistatic agent source 43 toward the pressure control valve 41. Thus, the antistatic agent flows into the pressure control valve 41 together with ozone, thereby to prevent the diaphragm valve element 68 of the pressure control valve 41 from being electrically charged (If already charged, the charge is removed.).

Next, the mixing valve 33 is switched so that a process gas, which is a mixture of ozone generated by the ozone generator 22 and water vapor generated by the steam generator 35, is supplied to the process chamber 24. Thereby, a photoresist formed on the wafer 2 becomes water-soluble. Also at this time, the shutoff valve 40 is opened, and the internal pressure of the process chamber 24 is maintained at a predetermined value through the operation of the pressure control valve 41. The shutoff valve 44 is also opened so that the antistatic agent is supplied from the antistatic agent source 43 toward the pressure control valve 41. Thus, the antistatic agent flows into the pressure control valve 41 together with ozone and water vapor, thereby to prevent the diaphragm valve element 68 of the pressure control valve 41 from being electrically charged.

Also at this time, the internal pressure of the steam generator 35 is maintained at a predetermined value through the operation of the pressure control valve 55, and the shutoff valve 57 is opened so that the antistatic agent is supplied from the antistatic agent source 56 toward the pressure control valve 55. Thus, the antistatic agent flows into the pressure control valve 55 together with water vapor, thereby to prevent the diaphragm valve element (68) of the pressure control valve 55 from being electrically charged.

Then, the mixing valve 33 is switched so that nitrogen gas is supplied to the process chamber 24, and the interior space of the process chamber 24 is purged with the nitrogen gas. Thereafter, the wafer 2 is unloaded from the process chamber 24.

The antistatic agent may be supplied to the pressure control valve 41 (55) whenever the processing unit 9 is being operated. In this case, the electrical charge of the diaphragm valve element (68) can be prevented more certainly. Alternatively, the antistatic agent may be supplied to the pressure control valve 41 (55) only when a gas flows through the pressure control valve, or at regular time intervals or at irregular time intervals. In this case, the consumption of the antistatic agent may be reduced.

As described above, according to the foregoing embodiment, the antistatic agent source 43 (46) is connected to the gas flow line 31 (32), which is provided thereon with the pressure control valve 41 (55) of a diaphragm valve type, at the position upstream of the pressure control valve 41 (55), and the antistatic agent is supplied from antistatic agent source 43 (46) to the pressure control valve 41 (55). Thus, failure of the pressure control valve 41 (55) due to discharging of static charge can be avoided, pressure in the process chamber 24 (steam generator 35) disposed on upstream side of the gas flow line 31 (32) can be controlled accurately, and as a result, the wafer 2 (i.e., process object) can be processed appropriately. Note that, since deionized water has a low electrical conductivity, it is effective to supply the antistatic agent into the pressure control valve 41 (55) even if water vapor produced from deionized water or a gas containing water vapor produced from deionized water flows through the pressure control valve 41 (55).

It is preferable that a supply flow rate range of the antistatic agent ensuring that change in internal pressure of the processing chamber 24 (steam generator 35) does not occur is determined beforehand through experiments, and that the antistatic agent is supplied from the antistatic solution source 43 (56) to the pressure control valve 41 (55) at a flow rate within the supply flow rate range. According to the above, the internal pressure of the processing chamber 24 (steam generator 35) can be maintained at a desired value certainly regardless that the antistatic agent is supplied or not, and thus defective process due to fluctuation of the internal pressure can be avoided.

It is preferable that the supply flow rate range of the antistatic agent is determined considering the characteristics of devices disposed downstream of the pressure control valve. In the foregoing embodiment, the mist trap 42 and the ozone killer 53 are disposed downstream of the pressure control valve 42. If the antistatic agent flows into the ozone killer 53, the ozone decomposing process in the ozone killer 53 may adversely affected. Thus, it is preferable that the supply flow rate of the antistatic agent be set within a range ensuring that the antistatic agent thus supplied is removed and separated by the mist trap and does not flow into the ozone killer 53. Such a supply flow rate range of the antistatic agent may be determined beforehand through experiments.

The invention claimed is:

1. A processing apparatus comprising: a process chamber in which a process object is processed with a process gas; a plurality of gas flow lines each provided to flow a process gas there through, the gas flow lines including a process gas supply line for supplying the process gas from a process gas source into the process chamber and a process gas discharge line for discharging the process gas from the process chamber; a diaphragm valve provided on one of the gas flow lines; and an antistatic agent source connected to said one gas flow line at a position upstream, with respect to a flowing direction of the process gas flowing through said one gas flow line, of the diaphragm valve to supply an antistatic agent to said one gas flow line thereby to supply the antistatic agent to the diaphragm valve and to prevent the diaphragm valve from being electrically charged, and wherein the diaphragm valve is provided on the process gas discharge line as said one gas flow line, and wherein the antistatic agent source is connected to the gas discharge line at a position between the process chamber and the diaphragm valve so that the antistatic agent source is injected.

2. The processing apparatus according to claim 1, wherein the diaphragm valve is provided as a pressure control valve to control an internal pressure of the process chamber.

3. The processing apparatus according to claim 2, wherein the antistatic agent source is configured to supply the antistatic agent at a flow rate within a flow rate range ensuring that change in the internal pressure of the process chamber due to supply of the antistatic agent does not occur.

4. The processing apparatus according to claim 1, further comprising a steam generator that generates water vapor as at least a part of the process gas, wherein a steam discharge line as said one gas flow line is connected to the steam generator to discharge therefrom water vapor, and wherein the diaphragm valve is provided on the steam discharge line.

5. The processing apparatus according to claim 4, wherein the diaphragm valve is provided as a pressure control valve to control an internal pressure of the steam generator.

6. The processing apparatus according to claim 5, wherein the antistatic agent source is configured to supply the antistatic agent at a flow rate within a flow rate range ensuring that change in the internal pressure of the steam generator due to supply of the antistatic agent does not occur.

7. The processing apparatus according to claim 1, wherein the antistatic agent comprises a liquid, which is deionized water into which carbon dioxide gas is dissolved.

8. The processing apparatus according to claim 1, wherein the process gas contains water vapor.

9. The processing apparatus according to claim 1, wherein: the process gas contains water vapor and ozone; the gas discharge line is provided thereon with a mist trap that removes moisture contained in the processing fluid and an ozone killer that decomposes ozone positioned downstream of the mist trap; and the antistatic agent source is configured to supply the antistatic agent at a flow rate within a flow rate range ensuring that the antistatic agent is removed by the mist trap and does not flow into the ozone killer.

10. A processing apparatus comprising:
    a process chamber in which a process object is processed with a process gas;
    a process gas supply line connected to the process chamber to supply a process gas into the process chamber;
    a process gas discharge line connected to the process chamber to discharge the process gas from the process chamber; and
    a diaphragm valve provided on the process gas discharge line to control discharging of the process gas from the process chamber; and
    an antistatic agent source connected to the process gas discharge line at a position downstream from the process chamber and upstream of the diaphragm valve to supply an antistatic agent to the diaphragm valve thereby to prevent the diaphragm valve from being electrically charged.

11. The processing apparatus according to claim 10, wherein the diaphragm valve is provided as a pressure control valve to control an internal pressure of the process chamber.

12. The processing apparatus according to claim 10, further comprising an ozone generator configured to generate ozone and a steam generator configured to generate water vapor, wherein the process chamber is connected to the ozone generator and the steam generator through the process gas supply line such that the process object is processed with a mixture of the ozone and the water vapor, and the mixture having been used to process the process object is discharged through the diaphragm valve provided on the process gas discharge line.

13. The processing apparatus according to claim 12, wherein the antistatic agent comprises a liquid, which is a deionized water into which carbon dioxide gas is dissolved.

14. The processing apparatus according to claim 12, wherein: the gas discharge line is provided thereon with a mist trap that removes moisture contained in the processing fluid and an ozone killer that decomposes ozone positioned downstream of the mist trap; and the antistatic agent source is configured to supply the antistatic agent at a flow rate within a flow rate range ensuring that the antistatic agent is removed by the mist trap and does not flow into the ozone killer.

* * * * *